(12) United States Patent
Bandyopadhyay

(10) Patent No.: US 12,009,791 B2
(45) Date of Patent: Jun. 11, 2024

(54) INCREASING POWER EFFICIENCY IN A DIGITAL FEEDBACK CLASS D DRIVER

(71) Applicant: Analog Devices, Inc., Wilmington, MA (US)

(72) Inventor: Abhishek Bandyopadhyay, Winchester, MA (US)

(73) Assignee: Analog Devices, Inc., Wilmington, MA (US)

( * ) Notice: Subject to any disclaimer, the term of this patent is extended or adjusted under 35 U.S.C. 154(b) by 77 days.

(21) Appl. No.: 17/702,312

(22) Filed: Mar. 23, 2022

(65) Prior Publication Data

US 2022/0216836 A1 Jul. 7, 2022

Related U.S. Application Data

(63) Continuation of application No. PCT/US2020/052358, filed on Sep. 24, 2020.

(60) Provisional application No. 62/904,962, filed on Sep. 24, 2019.

(51) Int. Cl.
*H03F 3/217* (2006.01)
*H03M 3/00* (2006.01)
*H04R 3/02* (2006.01)

(52) U.S. Cl.
CPC .......... *H03F 3/2175* (2013.01); *H03M 3/412* (2013.01); *H03M 3/464* (2013.01); *H04R 3/02* (2013.01); *H03F 2200/03* (2013.01); *H03F 2200/331* (2013.01); *H03F 2200/351* (2013.01)

(58) Field of Classification Search
CPC ............... H03F 3/2175; H03F 2200/03; H03F 2200/331; H03F 2200/351; H03M 3/412; H03M 3/464
See application file for complete search history.

(56) References Cited

U.S. PATENT DOCUMENTS

| 10,790,790 B2* | 9/2020 | McKenzie | H03L 7/0816 |
| 2006/0072657 A1* | 4/2006 | Putzeys | H03M 3/506 |
| | | | 375/238 |
| 2008/0042745 A1* | 2/2008 | Kozak | H03F 3/217 |
| | | | 330/251 |
| 2013/0272545 A1 | 10/2013 | Kinyau et al. | |
| 2014/0301571 A1* | 10/2014 | Melanson | H04R 3/002 |
| | | | 381/111 |
| 2018/0205352 A1* | 7/2018 | McKenzie | H03F 3/2171 |

(Continued)

OTHER PUBLICATIONS

Cope et al., *A 2×20W 0.0013% THD+N Class D Audio Amplifier with Consistent Performance Up to Maximum Power Level*, 2018 IEEE International Solid State Circuits Conference, 3 pages.

*Primary Examiner* — David L Ton
(74) *Attorney, Agent, or Firm* — ARENTFOX SCHIFF LLP

(57) ABSTRACT

Systems and methods are provided for architectures for a digital class D driver that increase the power efficiency of the class D driver. In particular, systems and methods are provided for a digital class D driver having a feedback analog-to-digital converter (ADC) that can have a latency of 1 cycle or more than 1 cycle. A feedback ADC with a latency of 1 cycle or more is significantly lower power than a low latency feedback ADC. Systems and methods are disclosed for a power efficient digital class D driver architecture that allows for a latency of one or more cycles in the feedback ADC.

20 Claims, 7 Drawing Sheets

(56) References Cited

U.S. PATENT DOCUMENTS

2020/0036352 A1* 1/2020 Zhu ..................... H03G 3/3005
2022/0045691 A1* 2/2022 Spirer ..................... H03M 3/33

* cited by examiner

INCREASING POWER EFFICIENCY IN A DIGITAL FEEDBACK CLASS D DRIVER

CROSS REFERENCE TO RELATED APPLICATIONS

This application is related to and claims the benefit of priority under 35 U.S.C. § 119(e) to International Patent Application No. PCT/US2020/052358, entitled "INCREASING POWER EFFICIENCY IN A DIGITAL FEEDBACK CLASS D DRIVER" filed Sep. 24, 2020, and U.S. Provisional Patent Application No. 62/904,962, entitled "Increasing Power Efficiency in a Digital Feedback Class D Driver," filed Sep. 24, 2019, which applications are hereby incorporated by reference herein in their entireties.

FIELD OF THE DISCLOSURE

The present invention relates to class D drivers, and, more specifically, digital feedback class D drivers.

BACKGROUND

Class D devices, such as drivers, modulators, converters, and amplifiers, can be used in audio devices such as speakers. In a conventional transistor amplifier, the output stage includes transistors that supply continuous output current. However, in conventional amplifiers, the output stage power dissipation is large. Class D amplifiers, dissipate much less power. Class D amplifiers use switches as amplifying devices. In particular, a class D amplifier output stage switches between the positive and negative power supplies so as to produce a train of voltage pulses. This reduces power dissipation because the output transistors have zero current when not switching, and have a low voltage when they are conducting current. Thus, class D devices have lower power dissipation, produce less heat, save circuit board space and cost, and (in portable systems) extend battery life.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY

Systems and methods are provided for a digital class D driver that increases power efficiency. The digital class D driver presented herein includes a feedback analog-to-digital converter (ADC). Using the techniques discussed herein, the feedback ADC is a low power ADC and can have a 1 clock cycle delay. In some examples, the class D driver is an amplifier and, in some examples, the class D driver is a speaker driver.

According to one aspect, an architecture for a class D driver comprises a first summer configured to receive a digital input signal; a digital modulator configured to receive a summer output and produce digital output; and an analog feedback loop from a driver output line to the first summer, the analog feedback loop including: an analog-to-digital converter comprising a loop filter and a first quantizer, and a second summer configured to add a digital output from the first quantizer and a second digital input, wherein a second summer output is input to the first summer.

In some implementations, the architecture includes a second quantizer coupled to the digital modulator, configured to quantize a digital modulator signal, wherein a second quantizer output is the second digital input to the second summer. In some examples, the second quantizer is a single-bit quantizer. In some implementations, the architecture includes a transfer function module configured to receive the digital input signal and add a delay to the digital input signal, wherein a transfer function module output is the second digital input to the second summer.

In some implementations, the architecture includes a digital-to-analog converter, wherein the digital-to-analog converter is coupled to the second summer output, wherein the digital-to-analog converter converts the second summer output to a feedback loop analog signal, and wherein the feedback loop analog signal is fed back to an analog feedback loop input. In some implementations, the architecture includes a third summer coupled to the digital-to-analog converter and the driver output line, wherein the feedback loop analog signal is input to the third summer. In some examples, the third summer is configured to subtract the feedback loop analog signal from a driver output signal resulting in an error content signal, and the error content signal is output from the third summer to the loop filter.

In some implementations, the architecture includes a power stage configured to receive a digital modulator output and generate a driver output signal for the driver output line. In some examples, the first quantizer is a multi-bit quantizer. In some examples, the first quantizer includes an excess loop delay. In some examples, the analog feedback loop includes at least a one cycle delay.

According to one aspect, a method for a digital class D driver comprises receiving a digital input signal at a first summer performing digital modulation on a first summer output, at a digital modulator; amplifying a digital modulator output at a power stage and generating a driver output signal; filtering an error signal from the driver output signal through an analog feedback loop from a driver output line to the first summer; quantizing the filtered signal at a first quantizer in the analog feedback loop; adding the quantized filtered signal and a second digital signal at a second summer to generate a second summer summed signal; and subtracting, at the first summer, the second summer summed signal from the digital input signal.

In some implementations, the method includes quantizing a digital modulator signal at a second quantizer, wherein a second quantizer output is the second digital signal input to the second summer. In some implementations, the method includes receiving the digital input signal at a transfer function module, and adding a delay to the digital input signal at the transfer function module, wherein a transfer function module output is the second digital input to the second summer. In some implementations, the method includes adding a delay to the analog feedback loop from a driver output line to the first summer.

In some implementations, the method includes converting the quantized filtered signal to a feedback loop analog signal and, at a third summer, subtracting the feedback loop analog signal from the driver output signal to generate the error signal.

The drawings show exemplary digital Class D driver circuits and configurations. Variations of these circuits, for example, changing the positions of, adding, or removing certain elements from the circuits are not beyond the scope of the present invention. The illustrated pace detectors, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

Embodiments herein relate to new architectures for a digital class D driver that increases the power efficiency of the class D driver. In particular, systems and methods are provided for a digital class D driver having a feedback analog-to-digital converter (ADC). Systems and methods are disclosed for a power efficient (low power) digital class D driver architecture that allows for a latency of one or more cycles in the feedback ADC.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Figure 1:
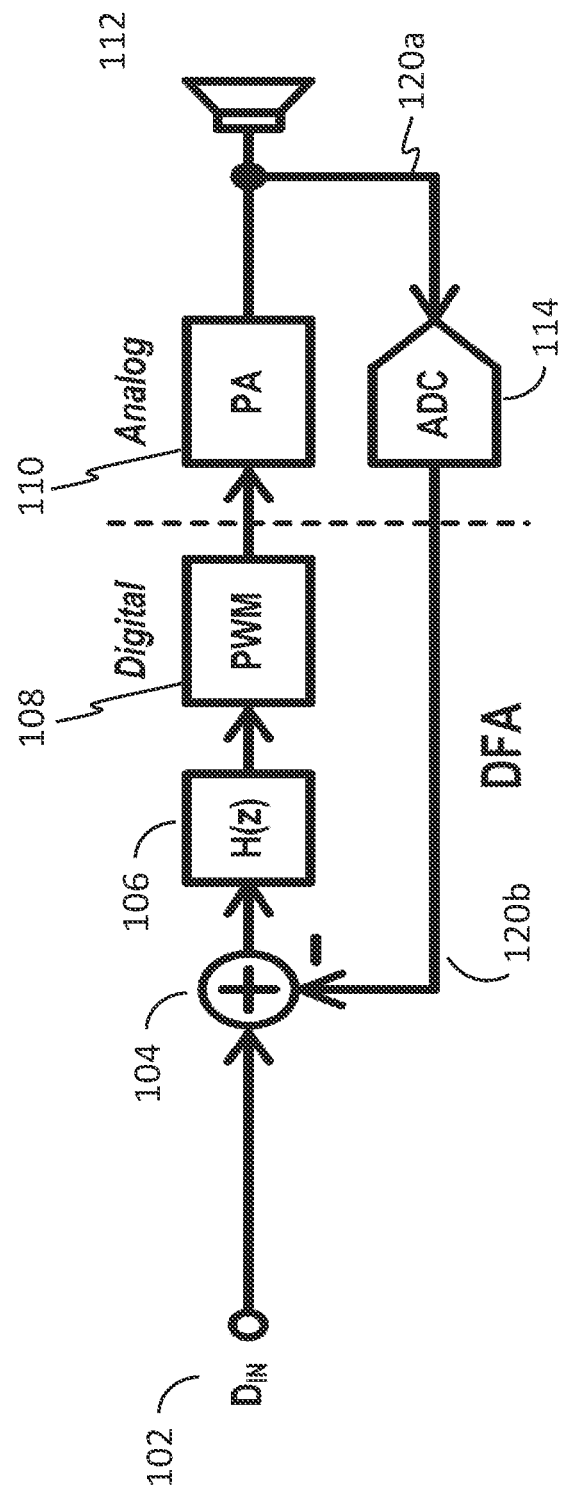
FIG. 1 depicts an example of a class D driver.

FIG. 1 depicts an example conventional digital class D driver 100. The driver 100 receives a digital signal input 102, which is mixed 104 with a digital signal from a feedback loop 120a, 120b, and input to a transfer function module 106. The output from the transfer function module 106 is input to a pulse width modulator (PWM) 108. The driver may include a pulse density modulator (PDM), and a sigma delta converter. The output from the pulse width modulator 108 is signal that is input to the analog module 110. In some examples, the analog module 110 includes an H-bridge. In some examples, the analog module 110 includes an amplifier.

The output from the analog module 110 is input to a speaker 112. Additionally, the output from the analog module 110 is fed back to the summer 104 via a first feedback line 120a, 120b. In particular, the analog module output is input to an analog-to-digital converter (ADC) 114 in the feedback line, which digitizes the analog module 110 output. The digitized signal is input to the summer 104. The circuit shown in FIG. 1 uses a very fast, low latency, ADC 114 for the feedback loop. In particular, the ADC 114 resolves within ⅟10 of a clock cycle. Additionally, the ADC 114 limits the signal to noise ratio and the power of a device that includes the driver 100.

Figure 2:
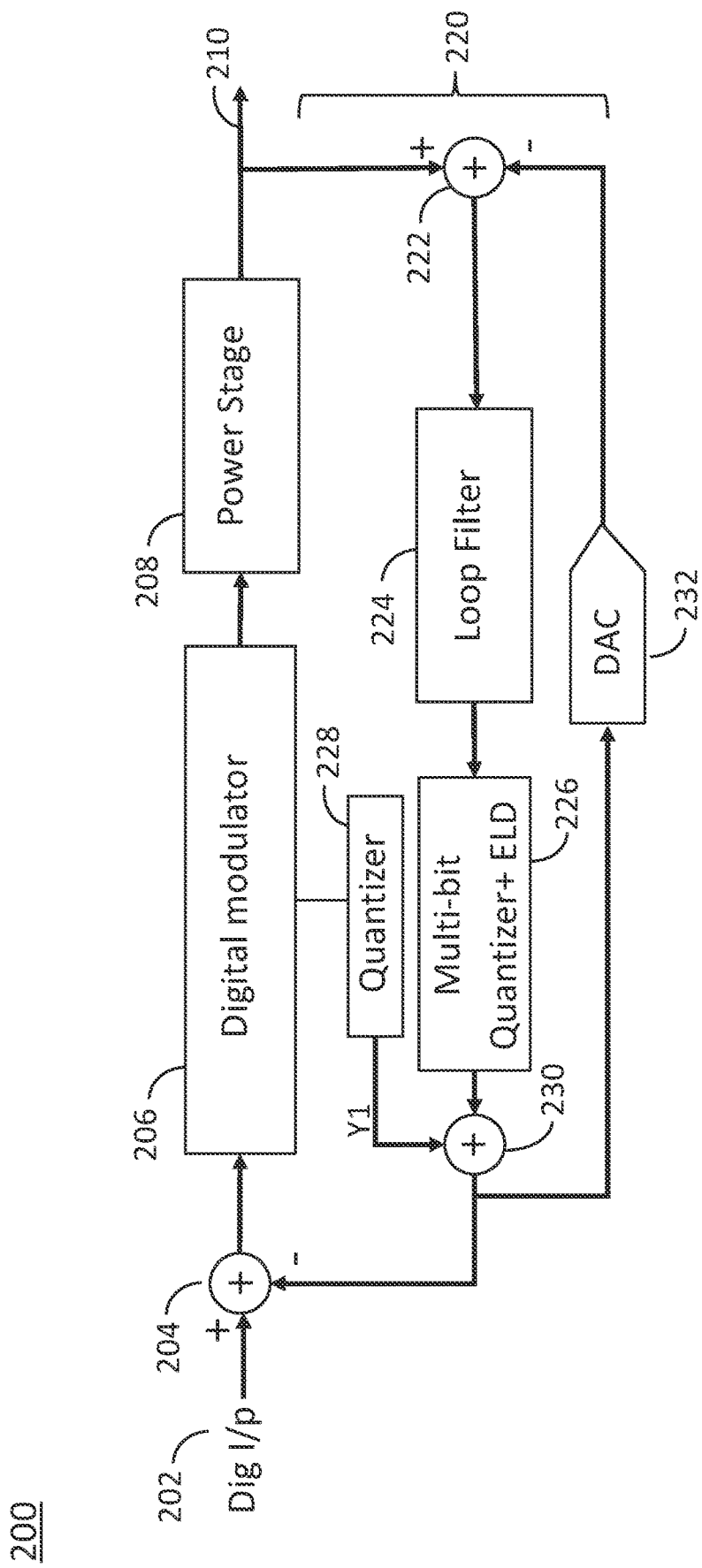
FIG. 2 depicts an example feedback class D driver, in accordance with various embodiments of the disclosure.

FIG. 2 depicts an example digital feedback class D driver 200, in accordance with various embodiments of the disclosure. The class D driver 200 shown in FIG. 2 includes a feedback loop 220 having an ADC. The ADC in the driver 200 can have a higher latency than traditional class D feedback loop ADCs. For example, the ADC can have one clock cycle latency or higher.

The class D driver 200 includes a digital input 202, a first summer 204, a digital modulator 206, a power stage 208, and an output 210. The class D driver 200 also includes an ADC feedback loop 220 from the output of the power stage 208 to the first summer 204. In some examples, the ADC feedback loop 220 is tapped from the output of a speaker (not shown), such that the speaker is positioned after the power stage and before the output 210, and the output from the speaker is input to an ADC feedback loop third summer 222.

The ADC feedback loop 220 includes a third summer 222, an analog loop filter 224, a first quantizer 226, a second summer 230, and a DAC 232. According to various examples, the loop filter 224, the DAC 232, and the first quantizer 226 comprise the analog-to-digital converter (ADC), converting an analog signal input to the loop filter 224 to a digital signal output from the first quantizer 226. In some examples, the loop filter 224 is a low pass filter. In some examples, the loop filter 224 includes an integrator, and in some examples, the loop filter 224 includes a cascade of integrators. The integrators include resonators. In some examples, the loop filter 224 includes second or higher order filter functions. According to various examples, the first quantizer 226 is a multi-bit quantizer having embedded excess loop delay. Examples of multi-bit quantizers include 4-bit quantizers, 8-bit-quantizers, 16-bit quantizers, and 24-bit quantizers. In some examples, the first quantizer 226 is a single-bit quantizer. According to various implementations, the ADC feedback loop 220 includes one of a second order multi-bit ADC and a third order multi-bit ADC.

The class D driver 200 includes a second quantizer 228 coupled to the digital modulator 206 and the third summer 230. In some examples, the second quantizer 228 is a single-bit quantizer. In other examples, the second quantizer is a multi-bit quantizer. The second quantizer 228 receives an input from the digital modulator 206. In some examples, the second quantizer 228 receives a representation of signal content from the digital modulator 206 output. In some examples, the second quantizer 228 receives a representation of signal content from the digital modulator 206 from an intermediate state of the digital modulator 206.

In general, the class D driver 200 separates the error content from the signal content for the feedback loop 220. The digital modulator 206 outputs the signal content to the power stage 208, and, in the class D driver 200, the digital modulator 206 also outputs a representation of the signal content to the second quantizer 228. In some examples, the digital modulator 206 is a multiple order digital loop filter, and digital modulator 206 outputs a representation of the signal content from an intermediate state to the second quantizer 228. The second quantizer 228 output is a digital output signal Y1. Thus, the signal content in the digital output signal Y1, output from the second quantizer 228, is added to the output of the first quantizer 226 at the third summer 230. According to various examples, the output of the first quantizer 226 represents the error content. The signal Y1 plus the error are input to the DAC 232, and also input to the first summer 204.

The DAC 232 converts the quantized signal plus quantized error from the second summer 230 to an analog signal plus error, and the output from the DAC 232 is input to the third summer 222. The power stage 208 output includes signal and error contents and is also input to the third summer 222. The DAC 232 output is subtracted from the power stage 208 output at the third summer 222 such that signal content is removed and the loop filter 224 receives the error content as input.

According to various features, the second quantizer 228, and the output signal Y1 from the second quantizer 228, enables the loop filter 224 to receive and process the error, and not signal content. In general, according to various examples, the analog feedback loop 220 components of the driver 200 process error signal, and signal content is not input to the loop filter 224. Removing signal content from the input to the loop filter 224 significantly decreases the overall input to the loop filter 224, thereby decreasing power consumption of the loop filter 224 and the first quantizer 226. Thus, the loop filter 224 is low power, and the feedback loop 220 is a low power feedback loop. In various examples the output of the second quantizer 228 is added after the loop filter 224 and before the first quantizer 226.

According to various implementations, a one clock cycle delay is added to the feedback loop 220. In some implementations, a two or three cycle delay is added to the feedback loop 220. In some examples, the delay is added at the first quantizer 226 as the excess loop delay compensation. According to some implementations, designing the driver 200 to include a delay in the feedback loop 220 allows for the use of higher-latency feedback loop 220 components, thereby decreasing the cost of the feedback loop 220 components and increasing the power efficiency of the feedback loop 220 components.

In some implementations, the second summer 230 and the first quantizer 226 switch positions, such that the output from the loop filter 224 is input to the second summer 230, and the output from the second summer 230 is input to the first quantizer 226. In these implementations, the output from the second quantizer 228 is added to the output from the loop filter 224 at the second summer 230.

In some implementations, there is a filter after the power stage 208, for filtering the signal before the driver output 210. In some examples, the filter is added before the line to the third summer 222, such that the filter output is input to the third summer 222. In other examples, the filter is added after the line to the third summer 222.

In some implementations, the line to the third summer 222 is positioned after a speaker. That is, a power stage output is input to a speaker, and a speaker output is output on the output line 210 and input to the third summer 222.

Figure 3:
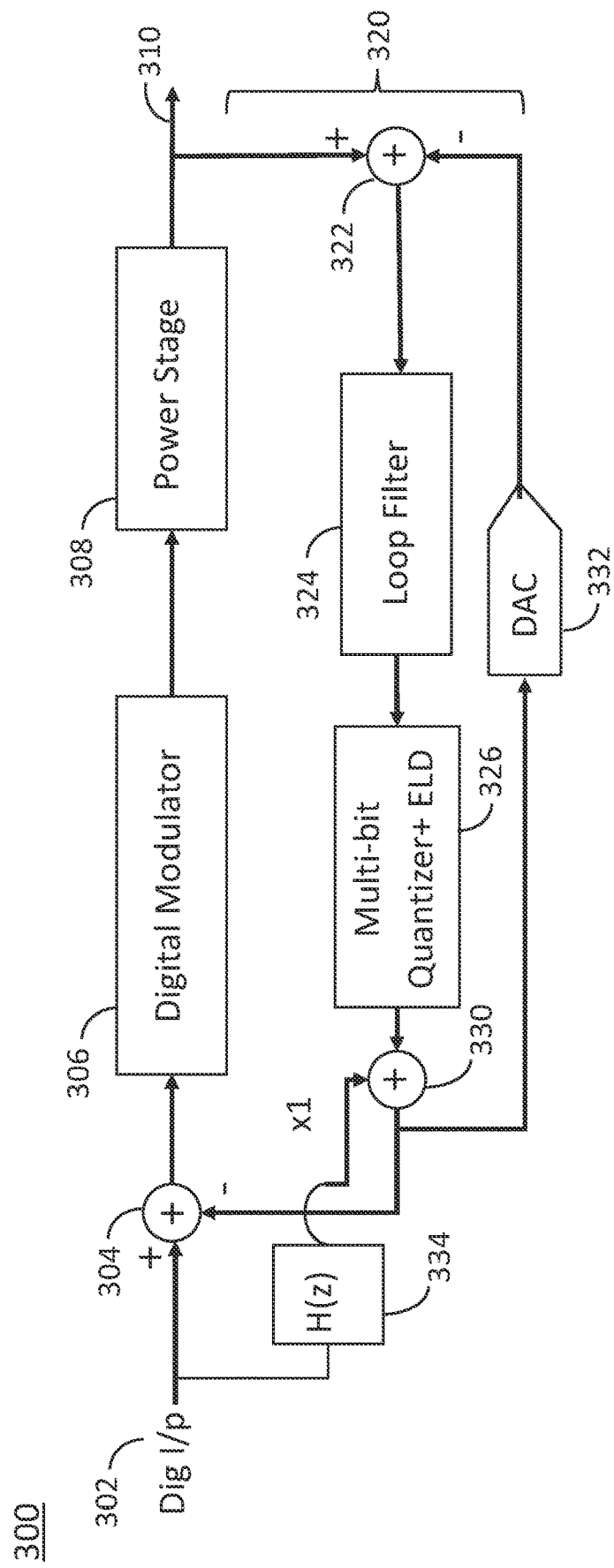
FIG. 3 depicts another example of a digital feedback class D driver, in accordance with various embodiments of the disclosure.

FIG. 3 depicts a digital feedback class D driver 300, in accordance with various embodiments of the disclosure. The digital feedback class D driver 300 includes a feedback loop 320 having an ADC. The ADC can have a higher latency than traditional class D feedback loop ADCs. For example, the ADC can have one clock cycle latency or higher. Additionally, in the driver 300, the digital input 302 is fed forward through a transfer function module 334 to the feedback loop 320, as described in greater detail below.

The class D driver 300 includes a digital input 302, a first summer 304, a digital modulator 306, a power stage 308, and an output 310. The class D driver 300 also includes an ADC feedback loop 320 from the output of the power stage 308 to the first summer 304. The ADC feedback loop 320 includes a third summer 322, a loop filter 324, a quantizer 326, a second summer 330, and a DAC 332. According to various examples, the loop filter 324, the DAC 332, and the quantizer 326 comprise an analog-to-digital converter (ADC), converting an analog signal input to the loop filter 324 to a digital signal output from the quantizer 326. In some examples, the loop filter 324 is a low pass filter. In some examples, the loop filter 324 includes an integrator, and in some examples, the loop filter 324 includes a cascade of integrators including resonators. In some examples, the loop filter 224 includes second or higher order filter functions. According to various examples, the quantizer 326 is a multi-bit quantizer having embedded excess loop delay. Examples of multi-bit quantizers include 4-bit quantizers, 8-bit-quantizers, 16-bit quantizers, and 24-bit quantizers. In some examples, the quantizer 326 is a single-bit quantizer. According to various implementations, the ADC feedback loop 320 includes one of a second order multi-bit ADC and a third order multi-bit ADC.

In general, the class D driver 300 separates the error content from the signal content and feeds the error content into the feedback loop 320. The digital input 302 is input to the first summer 304 where it is mixed with the feedback loop 320 output (the error) and the mixed signal is input to the digital modulator 306. In particular, the first summer 304 subtracts the feedback loop 320 output (the error content) from the digital input signal 302 to generate the mixed signal input to the digital modulator 306. The digital modulator 306 outputs a representation of the signal content to the power stage 308. According to various implementations, the digital modulator 306 introduces a first delay, and the first delay is matched by the analog feedback loop 320.

The digital input 302 is also input to the transfer function module 334. In some examples, the transfer function module 334 includes multiple filters, and in some examples, the transfer function module 334 includes digital filters. In some implementations, the transfer function module H(z) 334 matches the signal transfer function (STF) delay of the digital modulator 306, in order to synchronize the signal content on the digital modulator 306-power stage 308 line with the signal content in the analog feedback loop 320.

The transfer function module 334 output is a digital output signal X1 and includes signal content. The output signal X1 is added to the output of the quantizer 326 at the second summer 330. According to various examples, the output of the quantizer 326 is error content. The signal X1 plus the output from the quantizer 326 are input to the DAC 332, and thus the output from the DAC 332 includes signal plus error. The DAC 332 output is input to the third summer 322. At the third summer 322, the DAC 332 output is subtracted from the power stage 308 output, such that the signal content is removed and the loop filter 324 receives the error as input.

According to various examples, the transfer function module 334, and the transfer function output signal X1, enables the loop filter 324 to receive and process the error, and not the signal content. In general, according to various examples, the analog feedback loop 320 components of the driver 300 process error signal, and signal content is not input to the loop filter 324. Removing signal content from the input to the loop filter 324 significantly decreases the overall input to the loop filter 324, thereby decreasing power consumption of the loop filter 324 and the quantizer 326. Thus, the loop filter 324 is low power, and the feedback loop 320 is a low power feedback loop In some implementations, the second summer 330 and the first quantizer 326 switch positions, such that the output from the loop filter 324 is input to the second summer 330, and the output from the second summer 330 is input to the first quantizer 326. In these implementations, the output from the transfer function module 334 is added to the output from the loop filter 324 at the second summer 330.

According to various implementations, the class D driver 300 includes a second order multibit ADC in the feedback loop 320. In some implementations, the class D driver 300 includes a third or multi order multibit ADC in the feedback loop 320. According to some examples, the quantizer 326 includes an embedded ELD. According to various implementations, a one clock cycle delay is added to the feedback loop 320. In some implementations, a two or three cycle delay is added to the feedback loop 320. In some examples, the delay is added at the quantizer 326 as the excess loop delay. According to some implementations, designing the driver 300 to include a delay in the feedback loop 320 allows for the use of higher-latency feedback loop 320 components, thereby decreasing the cost of the feedback loop 320 components and increasing the power efficiency of the feedback loop 320 components.

In general, various implementations disclosed herein improve the signal to noise ratio using a digital feed-forward architecture. According to various implementations, class D driver 200 and the class D driver 300 improve signal to noise ratio by adding a digital feed forward line. In some examples, an analog feed forward line can be used, but an analog feedforward line can be unstable. In some implementations, for the ADC feedback loop, the signal input to the ADC feedback loop is a 1-bit signal, and a comparator is used in place of a quantizer. In particular, in some examples, since the ADC feedback loop processes just the error and not the signal content, a single bit is used to represent the error, and the single bit input to the ADC feedback loop allows for the use of a single comparator as a quantizer. According to various implementations, a multibit quantizer is used in the feed-forward loop and a single-bit quantizer is used in the feedback loop.

Figure 4:
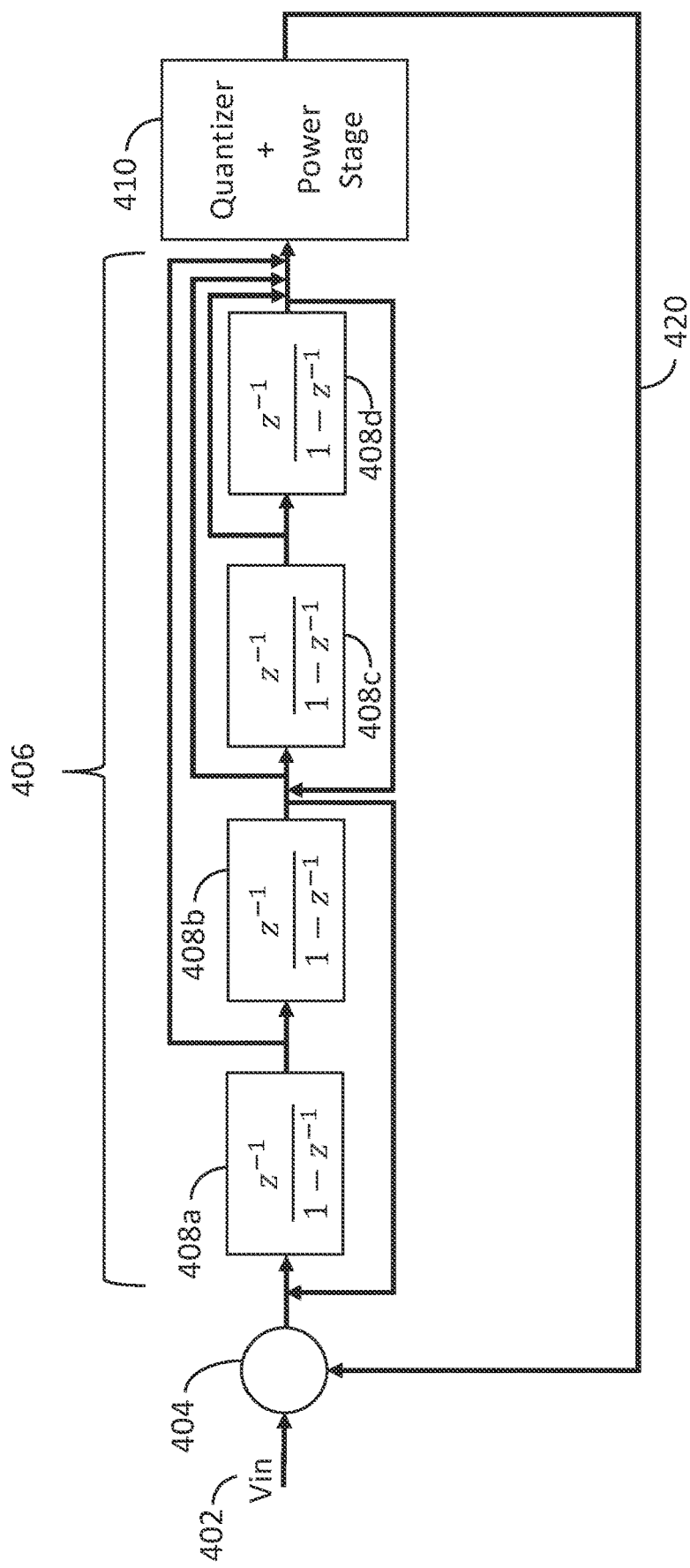
FIG. 4 is a diagram showing an example of a digital modulator, according to various embodiments of the disclosure.

FIG. 4 is a diagram showing an example of a driver 400 including a digital modulator 406. The driver 400 includes an input 402, a summer 404, a digital modulator 406 having multiple integrators 408a-408d, a quantizer and power stage module 410, and a feedback loop 420. If a delay is introduced in the feedback loop 420, the loop can be unstable. Thus, for stability of the modulator, the ADC quantizing the feedback loop optimally has zero latency. In various examples, low latency ADC's are power hungry. In some examples, low latency ADC's have a complex design.

Figure 5:
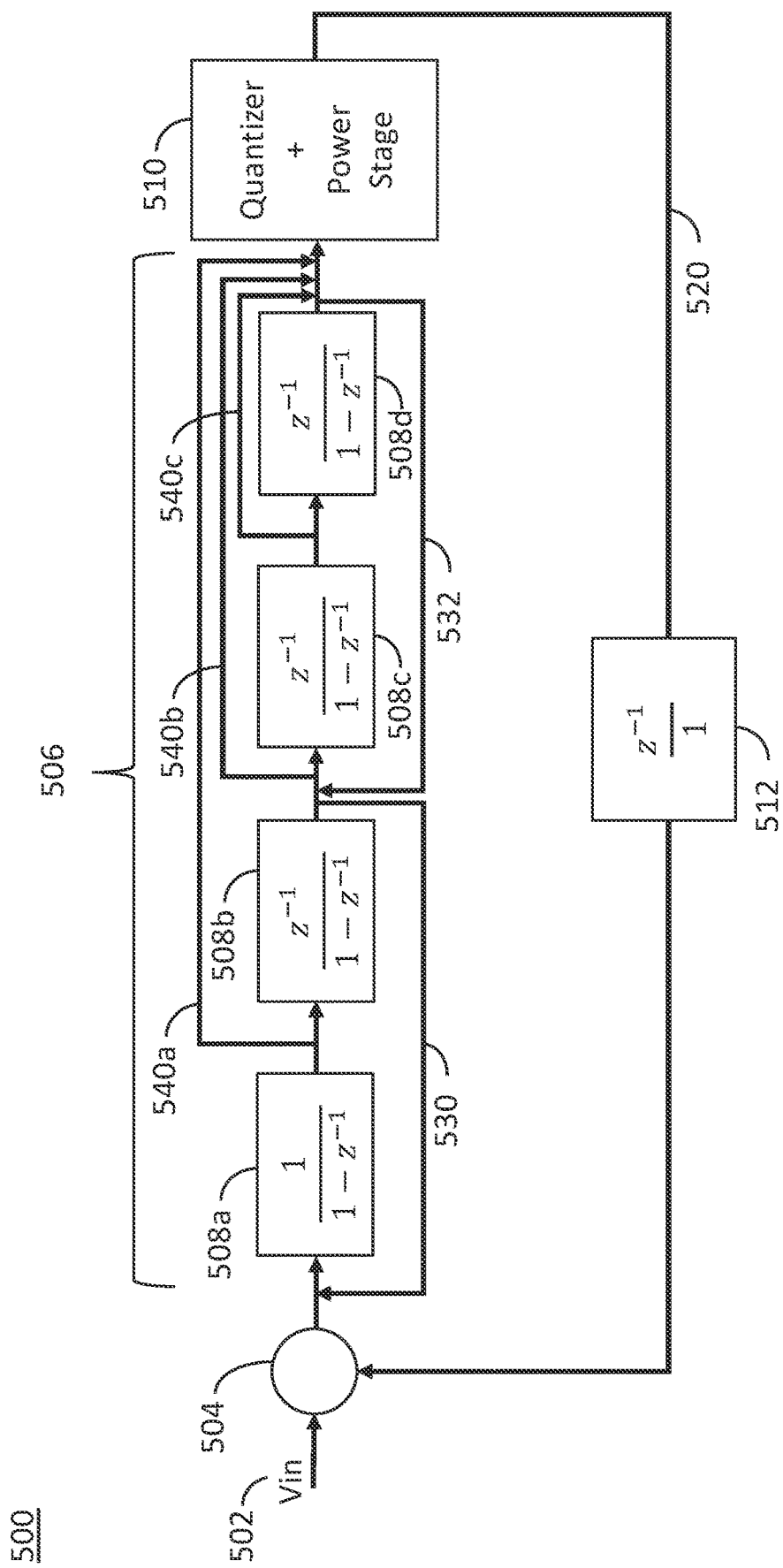
FIG. 5 is a diagram showing an example of a digital modulator, according to various embodiments of the disclosure.

FIG. 5 is a diagram showing an example of a driver 500 including a digital modulator 506, according to various embodiments of the disclosure. In various examples, the driver 500 includes an input 502, a summer 504, a digital modulator 506, a quantizer and power stage module 510, a first feedback loop 520, and a feedback loop delay block 512. The digital modulator 506 adds a delay in the feedback loop 520, as described in greater detail below. The digital modulator 506 includes a first integrator 508a, a second integrator 508b, a third integrator 508c, and a fourth integrator 508d. In various implementations, there is an ADC in the feedback loop 520, and a delay is added to allow the ADC at least a one clock cycle latency.

In some examples, the quantizer and power stage module 510 includes a one-bit quantizer. The quantizer output is input to a power stage, and the output from the power stage is output from the module 510 to the feedback loop 520. The output from the power stage of the module 510 is also the output of the driver 500. As shown in FIG. 5, the feedback loop delay block 512 is a ($z^{-1}$) delay, and adds one clock cycle delay to the feedback loop 520. In various examples, $z^{-1}$ is the last sample, such that the sample from the quantizer can be delayed. In particular, the numerator from a first integrator 508a in the digital modulator 506 is moved into the feedback loop 520, and in particular, into a feedback loop delay block 512. Thus, the first integrator 508a has a numerator of 1 (instead of $z^{-1}$), but the denominator of the first integrator 508a remains the same as the denominators of the second 508b, third 508c, and fourth 508d integrators $(1-z^{-1})$.

According to various examples, adding the feedback loop delay block 512 and adjusting the first integrator 508a function allows the ADC in the feedback loop 520 to have one clock cycle to resolve its output. Thus, the ADC in the feedback loop 520 is not instantaneous, allowing for a reduction in power. According to various implementations, the signal transfer function (STF) and the noise transfer function (NTF) of the driver 500 remains the same as the STF and NTF of the driver 400.

According to various implementations, the first feedback loop 520 is a loop from the output of the quantizer and power stage module 510 back to the summer 504. The first feedback loop 520 includes the delay block 512. In various examples, the first feedback loop 520 also includes an ADC.

As shown in FIG. 5, the digital modulator 506 includes two feedback loops 530, 532 and three feed-forward loops 540a, 540b, 540c. A first digital modulator feedback loop 530 is a loop from the output of the second integrator 508b to the input of the first integrator 508a. A second digital modulator feedback loop 532 is a loop from the output of the fourth integrator 508d to the input of the third integrator 508c. The digital modulator 506 also includes multiple feedforward loops. A first digital modulator feedforward loop 540a is a loop from the output of the first integrator 508a to the input line to the quantizer and power stage module 510. A second digital modulator feedforward loop 540b is a loop from the output of the second integrator 508b to the input line to the quantizer and power stage module 510. A third digital modulator feedforward loop 540c is a loop from the output of the third integrator 508c to the input line to the quantizer and power stage module 510.

Figure 6:
FIG. 6 is a flow chard illustrating a method for a digital class D driver, according to various embodiments of the disclosure.

FIG. 6 is a flow chard illustrating a method 600 for a digital class D driver, according to various embodiments. At step 602, a digital input signal is received at a first summer. At step 604, digital modulation is performed on the output from the first summer, at a digital modulator. At step 606, the digital modulator output is amplified at a power stage, generating a driver output signal. The driver output signal is split, such that one copy of the driver output signal is sent to an analog feedback loop.

At step 608, an error signal from the driver output signal is filtered through a loop filter in the analog feedback loop. The analog feedback loop is a loop from the driver output line back to the first summer. According to various examples, the analog feedback loop includes a loop filter, a first quantizer, and a second summer. At step 610, the filtered signal is quantized at the first quantizer in the analog feedback loop. At step 612, the quantized filtered signal is added to a second digital signal at the second summer to generate a second summer summed signal. At step 614, back at the first summer, the second summer summed signal is subtracted from the digital input signal. A delay is added to the analog feedback loop from the driver output line to the first summer.

In some implementations, the method 600 also includes quantizing a digital modulator signal at a second quantizer, wherein a second quantizer output is the second digital signal input to the second summer, as illustrated, for example in FIG. 2.

In some implementations, the method 600 also includes receiving the digital input signal at a transfer function module, and adding a delay to the digital input signal at the transfer function module, wherein a transfer function module output is the second digital input to the second summer, as illustrated, for example, in FIG. 3.

According to some implementations, the method 600 includes converting the second summer summed signal to a feedback loop analog signal and, at a third summer, subtracting the feedback loop analog signal from the driver output signal to generate the error signal. In this manner, the signal content is removed from the driver output and just the error portion of the signal is input to the analog feedback loop.

Figure 7:
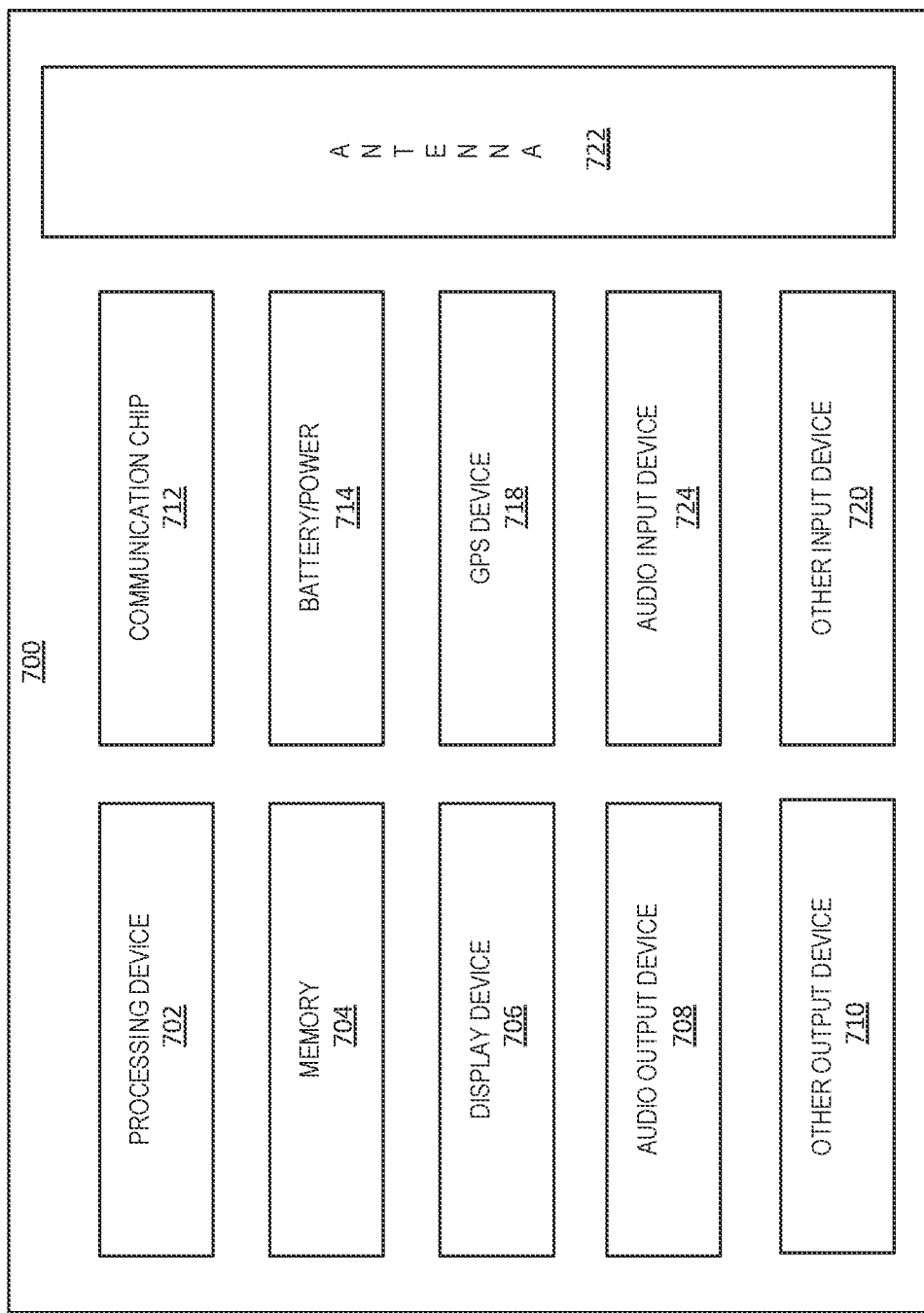
FIG. 7 is a block diagram of an example electrical device that may include one or more class D drivers, in accordance with various embodiments of the disclosure.

FIG. 7 is a block diagram of an example electrical device 700 that may include one or more digital class D drivers, in accordance with any of the embodiments disclosed herein. A number of components are illustrated in FIG. 7 as included in the electrical device 700, but any one or more of these components may be omitted or duplicated, as suitable for the application. In some embodiments, some or all of the components included in the electrical device 700 may be attached to one or more motherboards. In some embodiments, some or all of these components are fabricated onto a single system-on-a-chip (SoC) die.

Additionally, in various embodiments, the electrical device 700 may not include one or more of the components illustrated in FIG. 7, but the electrical device 700 may include interface circuitry for coupling to the one or more components. For example, the electrical device 700 may not include a display device 706, but may include display device interface circuitry (e.g., a connector and driver circuitry) to which a display device 706 may be coupled. In another set of examples, the electrical device 700 may not include an audio input device 724 or an audio output device 708, but may include audio input or output device interface circuitry (e.g., connectors and supporting circuitry) to which an audio input device 724 or audio output device 708 may be coupled.

The electrical device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 700 may include a memory 704, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 704 may include memory that shares a die with the processing device 702. This memory may be used as cache memory and may include embedded dynamic random access memory (eDRAM) or spin transfer torque magnetic random access memory (STT-MRAM).

In some embodiments, the electrical device 700 may include a communication chip 712 (e.g., one or more communication chips). For example, the communication chip 712 may be configured for managing wireless communications for the transfer of data to and from the electrical device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 712 may operate in accordance with other wireless protocols in other embodiments. The electrical device 700 may include an antenna 722 to facilitate wireless communications and/or to receive other wireless communications (such as AM or FM radio transmissions).

In some embodiments, the communication chip 712 may manage wired communications, such as electrical, optical, or any other suitable communication protocols (e.g., the Ethernet). As noted above, the communication chip 712 may include multiple communication chips. For instance, a first communication chip 712 may be dedicated to shorter-range wireless communications such as Wi-Fi or Bluetooth, and a second communication chip 712 may be dedicated to longer-range wireless communications such as global positioning system (GPS), EDGE, GPRS, CDMA, WiMAX, LTE, EV-DO, or others. In some embodiments, a first communication chip 712 may be dedicated to wireless communications, and a second communication chip 712 may be dedicated to wired communications.

The electrical device 700 may include battery/power circuitry 714. The battery/power circuitry 714 may include one or more energy storage devices (e.g., batteries or capacitors) and/or circuitry for coupling components of the electrical device 700 to an energy source separate from the electrical device 700 (e.g., AC line power).

The electrical device 700 may include a display device 706 (or corresponding interface circuitry, as discussed above). The display device 706 may include any visual indicators, such as a heads-up display, a computer monitor, a projector, a touchscreen display, a liquid crystal display (LCD), a light-emitting diode display, or a flat panel display.

The electrical device 700 may include an audio output device 708 (or corresponding interface circuitry, as discussed above). The audio output device 708 may include any device that generates an audible indicator, such as speakers, headsets, or earbuds.

The electrical device 700 may include an audio input device 724 (or corresponding interface circuitry, as discussed above). The audio input device 724 may include any device that generates a signal representative of a sound, such as microphones, microphone arrays, or digital instruments (e.g., instruments having a musical instrument digital interface (MIDI) output).

The electrical device 700 may include a GPS device 718 (or corresponding interface circuitry, as discussed above). The GPS device 718 may be in communication with a satellite-based system and may receive a location of the electrical device 700, as known in the art.

The electrical device 700 may include another output device 710 (or corresponding interface circuitry, as discussed above). Examples of the other output device 710 may include an audio codec, a video codec, a printer, a wired or wireless transmitter for providing information to other devices, or an additional storage device.

The electrical device 700 may include another input device 720 (or corresponding interface circuitry, as discussed above). Examples of the other input device 720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 700 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 700 may be any other electronic device that processes data.

SELECT EXAMPLES

Example 1 provides an architecture for a class D driver, comprising a first summer configured to receive a digital input signal; a digital modulator configured to receive a summer output and produce an analog output; and an analog feedback loop from a driver output line to the first summer, the analog feedback loop including: an analog-to-digital converter comprising a loop filter and a first quantizer, and a second summer configured to add a digital output from the first quantizer and a second digital input, wherein a second summer output is input to the first summer.

Example 2 provides the architecture of example 1, further comprising a second quantizer coupled to the digital modulator, configured to quantize a digital modulator signal, wherein a second quantizer output is the second digital input to the second summer.

Example 3 provides an architecture according to one or more of the preceding examples, wherein the second quantizer is a single-bit quantizer.

Example 4 provides an architecture according to one or more of the preceding examples, further comprising a transfer function module configured to receive the digital input signal and add a delay to the digital input signal, wherein a transfer function module output is the second digital input to the second summer.

Example 5 provides an architecture according to one or more of the preceding examples, further comprising a digital-to-analog converter, wherein the digital-to-analog converter is coupled to the second summer output, wherein the digital-to-analog converter converts the second summer output to a feedback loop analog signal, and wherein the feedback loop analog signal is fed back to an analog feedback loop input.

Example 6 provides an architecture according to one or more of the preceding examples, further comprising a third summer coupled to the digital-to-analog converter and the driver output line, wherein the feedback loop analog signal is input to the third summer.

Example 7 provides an architecture according to one or more of the preceding examples, wherein the third summer is configured to subtract the feedback loop analog signal from a driver output signal resulting in an error content signal, and the error content signal is output from the third summer to the loop filter.

Example 8 provides an architecture according to one or more of the preceding examples, further comprising a power stage configured to receive a digital modulator output and generate a driver output signal for the driver output line.

Example 9 provides an architecture according to one or more of the preceding examples, wherein the first quantizer is a multi-bit quantizer.

Example 10 provides an architecture according to one or more of the preceding examples, wherein the first quantizer includes an excess loop delay.

Example 11 provides an architecture according to one or more of the preceding examples, wherein the analog feedback loop includes at least a one cycle delay.

Example 12 provides a method for a digital class D driver, comprising receiving a digital input signal at a first summer; performing digital modulation on a first summer output, at a digital modulator; amplifying a digital modulator output at a power stage and generating a driver output signal; filtering an error signal from the driver output signal through an analog feedback loop from a driver output line to the first summer; quantizing the filtered signal at a first quantizer in the analog feedback loop; adding the quantized filtered signal and a second digital signal at a second summer to generate a second summer summed signal; and subtracting, at the first summer, the second summer summed signal from the digital input signal.

Example 13 provides a method according to one or more of the preceding examples, including quantizing a digital modulator signal at a second quantizer, wherein a second quantizer output is the second digital signal input to the second summer.

Example 14 provides a method according to one or more of the preceding examples, including receiving the digital input signal at a transfer function module, and adding a delay to the digital input signal at the transfer function module, wherein a transfer function module output is the second digital input to the second summer.

Example 15 provides a method according to one or more of the preceding examples, including adding a delay to the analog feedback loop from a driver output line to the first summer.

Example 16 provides a method according to one or more of the preceding examples, including converting the quantized filtered signal to a feedback loop analog signal and, at a third summer, subtracting the feedback loop analog signal from the driver output signal to generate the error signal.

Example 17 includes the class D driver of one or more of the preceding examples, some other example, or as otherwise discussed or depicted herein, wherein the class D driver includes a multi-bit feed-forward.

Example 18 includes the class D driver of one or more of the preceding examples, some other example, or as otherwise discussed or depicted herein, wherein the class D driver includes a single-bit feed-forward.

Example 19 includes an apparatus that includes a class D driver as discussed or depicted in any of the preceding examples, some other example, or as otherwise discussed or depicted herein.

Example 20 includes an apparatus comprising means to implement a class D driver as discussed or depicted in any of the preceding examples, some other example, or as otherwise discussed or depicted herein.

Example 21 includes a method for implementing or manufacturing a class D driver as discussed or depicted in any of the preceding examples, some other example, or as otherwise discussed or depicted herein.

Example 22 includes one or more non-transitory computer-readable media comprising instructions that, upon execution of the instructions by an electronic device, are to cause the electronic device to implement or manufacture a class D driver as discussed or depicted in any of the preceding examples, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

INTERPRETATION OF TERMS

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

The invention claimed is:

1. An architecture for a class D driver, comprising:
a first summer configured to receive a digital input signal;
a digital modulator configured to receive a summer output from the first summer and further configured to produce an output; and
an analog feedback loop from a driver output line to the first summer, the analog feedback loop including:
an analog-to-digital converter comprising a loop filter and a first quantizer, and
a second summer configured to add an analog-to-digital converter output and a second digital input signal, wherein a second summer output is input to the first summer.

2. The architecture of claim 1, further comprising a second quantizer coupled to the digital modulator, configured to quantize a digital modulator signal, wherein a second quantizer output is the second digital input signal to the second summer.

3. The architecture of claim 2, wherein the second quantizer is one of a single-hit quantizer and a multi-hit quantizer.

4. The architecture of claim 1, further comprising a transfer function module configured to receive and filter the digital input signal, wherein a transfer function module output is the second digital input signal that is input to the second summer.

5. The architecture of claim 1, further comprising a digital-to-analog converter, wherein the digital-to-analog converter is coupled to the second summer output, wherein the digital-to-analog converter converts the second summer output to a feedback loop analog signal, and wherein the feedback loop analog signal is fed back to an analog feedback loop input.

6. The architecture of claim 5, further comprising a third summer coupled to the digital-to-analog converter and the driver output line, wherein the feedback loop analog signal is input to the third summer.

7. The architecture of claim 6, wherein the third summer is configured to subtract the feedback loop analog signal from a driver output signal resulting in an error content signal, and the error content signal is output from the third summer to the loop filter.

8. The architecture of claim 1, further comprising a power stage configured to receive a digital modulator output and generate a driver output signal for the driver output line.

9. The architecture of claim 1, fluffier comprising a filter configured to filter the output from the digital modulator, wherein the driver output line is an output from the filter.

10. The architecture of claim 1, further comprising a speaker configured to receive the output from the digital modulator, wherein the driver output line is an output from the speaker.

11. The architecture of claim 1, wherein the analog-to-digital converter output is a digital output signal from the first quantizer.

12. The architecture of claim 1, wherein the analog-to-digital converter output is an output from the loop filter.

13. A method for a digital class D driver, comprising:
receiving a digital input signal at a first summer;
performing digital modulation on a first summer output from the first summer, at a digital modulator;
amplifying a digital modulator output at a power stage and generating a driver output signal;
filtering an error signal from the driver output signal through an analog feedback loop from a driver output line to the first summer, resulting in a filtered signal;
quantizing the filtered signal at a first quantizer in the analog feedback loop, resulting in a quantized filtered signal;
adding the quantized filtered signal and a second digital input signal at a second summer to generate a second summer summed signal; and
subtracting, at the first summer, the second summer summed signal from the digital input signal.

14. The method of claim 13, further comprising quantizing a digital modulator signal at a second quantizer, wherein a second quantizer output is the second digital input signal that is input to the second summer.

15. The method of claim 13, further comprising receiving the digital input signal at a transfer function module, and adding a delay to the digital input signal at the transfer function module, wherein a transfer function module output is the second digital input signal that is input to the second summer.

16. The method of claim 13, further comprising adding a delay to the analog feedback loop from a driver output line to the first summer.

17. The method of claim 13, further comprising converting the quantized filtered signal to a feedback loop analog signal and, at a third summer, subtracting the feedback loop analog signal from the driver output signal to generate the error signal.

18. A circuit for a digital class D driver, the circuit comprising:

a first summer configured to receive a digital input signal;

a digital modulator configured to receive a summer output from the first summer and is further configured to produce a digital modulator output;

means for amplifying the digital modulator output and generating a driver output signal; and an analog feedback loop from a driver output line to the first summer, the analog feedback loop including:

means for filtering an error signal from the driver output signal through the analog feedback loop from the driver output line to the first summer, wherein the analog feedback loop includes an analog-to-digital converter; and means for adding an analog-to-digital converter output and a second digital input signal to generate a summed feedback signal, wherein the summed feedback signal is input to the first summer.

19. The circuit of claim 18, further comprising means for quantizing a digital modulator signal to generate the second digital input signal.

20. The circuit of claim 18, further comprising means for filtering the digital input signal to generate the second digital, input signal.

* * * * *